(12) United States Patent
Jan et al.

(10) Patent No.: US 8,917,536 B2
(45) Date of Patent: Dec. 23, 2014

(54) ADAPTIVE REFERENCE SCHEME FOR MAGNETIC MEMORY APPLICATIONS

(71) Applicant: Headway Technologies, Inc., Milpitas, CA (US)

(72) Inventors: Guenole Jan, San Jose, CA (US); PoKang Wang, Los Altos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 62 days.

(21) Appl. No.: 13/660,176

(22) Filed: Oct. 25, 2012

(65) Prior Publication Data
US 2014/0119105 A1 May 1, 2014

(51) Int. Cl.
*G11C 11/00* (2006.01)

(52) U.S. Cl.
USPC ............ 365/148; 365/189.15; 365/210.1

(58) Field of Classification Search
CPC ....... G11C 7/14; G11C 11/4099; G11C 16/28
USPC ............ 365/148, 210.1, 210.15, 211, 189.15, 365/185.2, 205
See application file for complete search history.

(56) References Cited

U.S. PATENT DOCUMENTS

| | | | |
|---|---|---|---|
| 6,055,178 A | 4/2000 | Naji | |
| 6,317,376 B1 | 11/2001 | Tran et al. | |
| 6,385,111 B2 | 5/2002 | Tran et al. | |
| 6,426,907 B1 | 7/2002 | Hoenigschmid | |
| 6,693,827 B2 | 2/2004 | Kim | |
| 6,697,294 B1 | 2/2004 | Qi et al. | |
| 6,870,760 B2 | 3/2005 | Tsang | |
| 7,321,507 B2 | 1/2008 | Yang et al. | |
| 7,499,314 B2 | 3/2009 | Yang et al. | |
| 7,613,868 B2 | 11/2009 | Yang et al. | |
| 7,800,937 B2 | 9/2010 | Hung et al. | |
| 7,885,131 B2 | 2/2011 | Sakimura et al. | |
| 2003/0223268 A1 | 12/2003 | Tanizaki et al. | |
| 2010/0208511 A1 | 8/2010 | Rhie et al. | |

FOREIGN PATENT DOCUMENTS

WO    WO 2012/011161    1/2012

OTHER PUBLICATIONS

Co-pending US Patent HMG11-001, U.S. Appl. No. 13/345,116, filed Jan. 6, 2012, "Reference Averaging for MRAM Sense Amplifiers," by Perng-Fei Yuh, et al.
PCT Search Report PCT/US2013/066347 Mailed: Feb. 25, 2014, Headway Technologies, Inc.

*Primary Examiner* — Gene Auduong
(74) *Attorney, Agent, or Firm* — Saile Ackerman LLC; Stephen B. Ackerman

(57) ABSTRACT

A structure and method is described for an adaptive reference used in reading magnetic tunneling memory cells. A collection of magnetic tunneling memory cells are used to form a reference circuit and are coupled in parallel between circuit ground and a reference input to a sense amplifier. Each of the magnetic memory cells used to form the reference circuit are programmed to a magnetic parallel state or a magnetic anti-parallel state, wherein each different state produces a different resistance. By varying the number of parallel states in comparison to the anti-parallel states, where each of the two states produce a different resistance, the value of the reference circuit resistance can be adjusted to adapt to the resistance characteristics of a magnetic memory data cell to produce a more reliable read of the data programmed into the magnetic memory data cell.

11 Claims, 5 Drawing Sheets

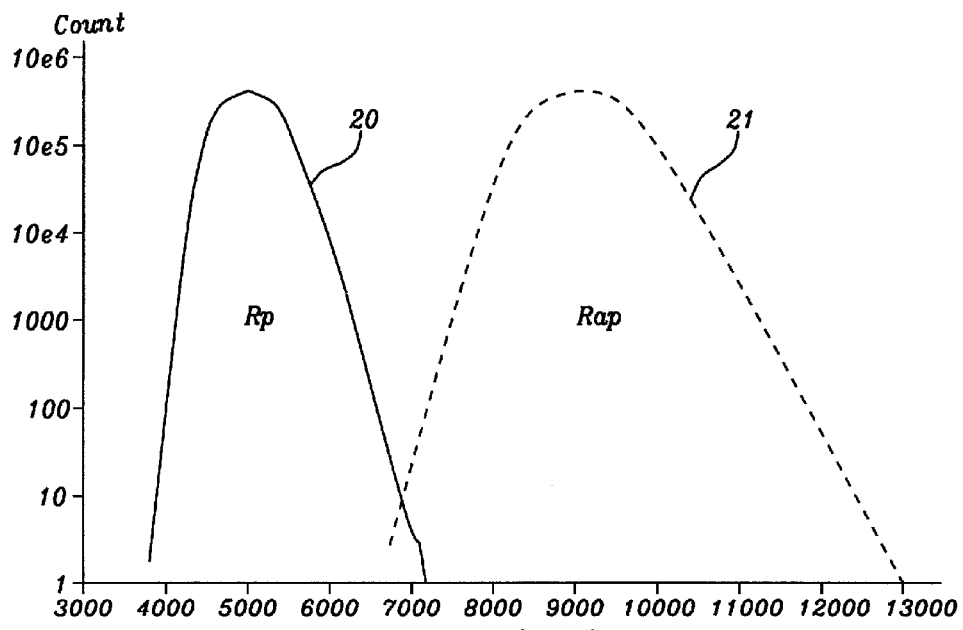
FIG. 2 - Prior Art
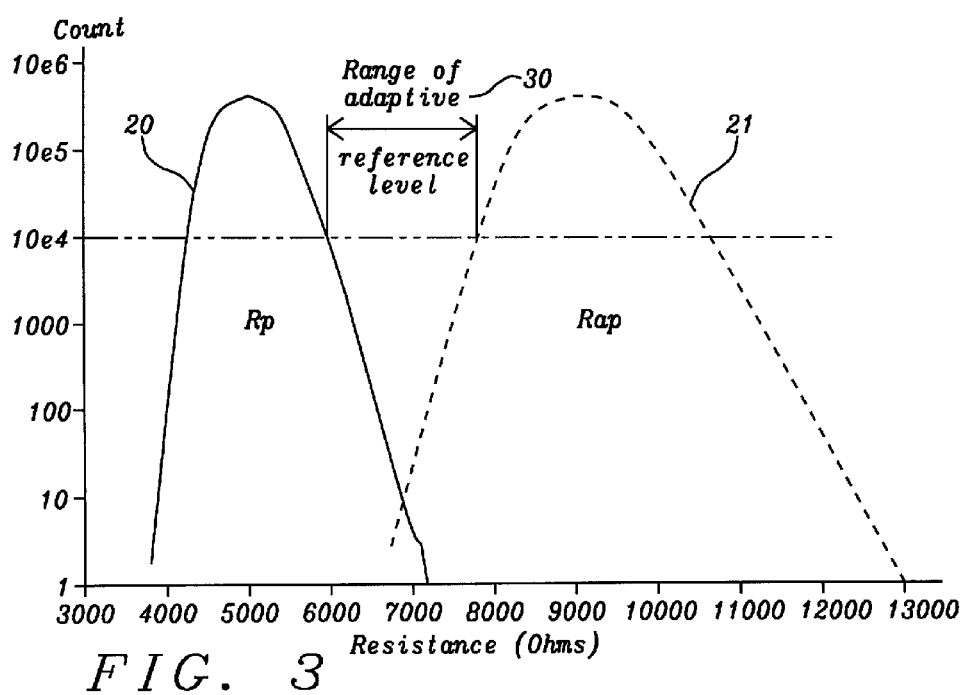
FIG. 3

ADAPTIVE REFERENCE SCHEME FOR MAGNETIC MEMORY APPLICATIONS

This application is related to U.S. patent application Ser. No. 13/345,116, filed on Jan. 6, 2012, and assigned to the same assignee as the present disclosure, and which is herein incorporated by reference in its entirety.

TECHNICAL FIELD

The present disclosure refers to a magnetic random access memory operations and more particularly reading random access of magnetic memory cells

BACKGROUND

In order to retrieve information from a magnetic memory array, a sense amplifier typically compares the current flowing through a memory cell under an applied voltage to a reference current. The reference current is generated by applying voltage to a set of reference cells, half of which are set to the high conductance state ("0" or P) and the other half to the low conductance state ("1" or AP), where "P" signifies that the magnetic domains of the cell are oriented in the same direction and "AP" signifies that the magnetic domains of the cell are oriented in opposite directions. The average current from the reference cells is then compared to the current from the memory cell, and a logical "0" or "1" output is generated by the sense amplifier. A schematic of an example of such an array is shown in FIG. 1, wherein each sense amplifier 10 is connected to at least one set of reference bit lines, RBL1 and RBL2, through a biasing and averaging circuitry 11, and connected to a set of memory cells 13 through biasing and selection circuitry 12. Generally each reference bit line is connected to several reference devices 14 and 15. For illustration, two reference devices 14 and 15 are shown for each bit line in FIG. 1. Reference word lines RWL1 and RWL2 select the reference device to be used. Similarly memory word lines WL1 and WL2 select the device to be read. In the simple implementation each memory word line WL1 and WL2 has its own set of reference cells, where word lines WL1 and WL2 may be the same as word lines RWL1 and RWL2, respectively.

U.S. Pat. No. 6,055,178 (Naji) is directed to an MRAM device comprising a memory array and a reference memory array, wherein the reference memory array is formed from magnetic memory cells to hold reference data in a row line. In U.S. Pat. No. 6,317,376 B1 and U.S. Pat. No. 6,385,111 B2 (Tran et al.) an MRAM device is directed to generating reference signals that are used to determine the resistance states of each memory cell. U.S. Pat. No. 6,426,907 B1 (Hoenigschmid) is directed to a reference circuit for an MRAM array, wherein reference cells representing a logical "1" and reference cells representing a logical "0" are coupled in parallel to establish a reference to measure the logical state of the memory cells. U.S. Pat. No. 6,697,294 B1 (Qi et al.) is directed a reference circuit for a magnetic tunnel junction MRAM, including two magnetic tunnel junctions, wherein one of the two is set to a low state and the second to a high state. In U.S. Pat. No. 6,870,760 B2 (Tsang) a method and system is directed to reading a magnetic memory, wherein a second state of a memory cell is determined using a disturb magnetic field thereby negating the need of a separate reference element. U.S. Pat. No. 7,321,507 B2 and U.S. Pat. No. 7,499,314 B2 (Yang et al) are directed to an MRAM reference cell sub-array that provides a mid point reference current to sense amplifiers. U.S. Pat. No. 7,613,868 B2 (Yang et al.) is directed to a system and method for reading and programming a magnetic memory cells. In U.S. Pat. No. 7,800,937 B2 (Hung et al.) a method is directed to reading an MRAM device, which includes partially switching magnetic moments in a reference cell to generate a reference current to be compared to a read current of a memory cell. U.S. Pat. No. 7,885,131 B2 (Sakimura et al.) is directed to a magnetic memory device, wherein a memory cell and a reference cell store data based on change in resistance value. US2002/0080648 A1 (Kim) is directed to a circuit for sensing a memory cell, which includes a memory cell and a reference cell.

When reading an MRAM using reference devices to create a reference current for comparison, the read margin is defined as the signal separation between that of the memory cells and the reference cells. There are three major sources of variations in reading an MRAM. The first is the sense-amp to sense amp variations, usually manifesting itself as variation of sense amp offset, which can be overcome by adjusting offset of each sense amp at factory. The second source of variation is the contribution from parasitic impendence, e.g. bit line resistance. This is often overcome by mimicking memory device bit lines with reference bit lines, and select from the multitude of reference devices ones that have similar parasitic impedance and loading as the target devices. The third source of variations is from the variations between reference devices. This can be minimized by averaging more reference devices. The usual minimum of two reference bit lines already reduces this variation by a factor of 1.4. Some system averages four reference bit lines to get a 2× reduction. Some architecture allows the averaging of even more reference devices to further reduce this. Because the variation of the two signal levels of "0" and "1" is not the same, the optimal reference level is not necessarily midway between "0" and "1" signal levels. So a systematic offset of the reference signal may be desired to bring it either closer to "0" or to "1".

The aforementioned methodologies are directed to producing an optimal consistent reference signal relative to the memory cell signals, but as devices are scaled smaller, both the manufacturing process and the material uniformity induces more device to device variations. When the variation reach a certain level, even a "perfect" reference signal is no longer adequate to allow reliably reading operations. To illustrate this issue FIG. 2 plots the resistance distribution Rp 20 and Rap 21 of the two magnetic states assuming a resistance covariance of 5% and a magneto-resistance ((Rap−Rp)/Rp) of 80% with a covariance of 5%. For a memory block of 8 Mb, it is clear from this graph that the strategy of using one consistent reference signal level is simply not a solution. In FIG. 2 it is shown that the two distributions of Rp and Rap overlap so that the two levels cannot be distinguished for all the 8 Mbits based on a resistance/current measurement. Typical covariance of the junction resistance for an magnetic tunnel junction (MTJ) array is 3.5% to 8% with a tunnel magneto-resistance (TMR) ratio of about 70% to 130%.

SUMMARY

It is an objective of the present disclosure to provide an adaptive reference signal to a sense amplifier for reading magnetic random access memory (MRAM) cells.

It is further an objective of the present disclosure to create the adaptive reference signal from four or more MRAM cells.

It is still further an objective of the present disclosure to provide an adaptive reference for each block of MRAM memory cells totaling approximately 1024 data bits.

It is also further an objective of the present disclosure to handle memory cell outliers by redundancy replacement when they cannot be corrected for by an adaptive reference signal.

It should be noted that the magnetic memory cell of the present disclosure refers to a magnetic tunnel junction, but can refer to any other magnetic memory device where response to magnetic states are similarly variable and similarly affected by the effects of a shrinking geometry. Also the use of the term "magnetic memory cell" herein implies a memory cell formed from a magnetic tunnel junction or similar device.

In the present disclosure an adaptive reference signal is provided to a sense amplifier to compare against a signal from magnetic random access memory cell. The adaptive reference signal is created from a plurality of reference cell pairs connected in parallel, constructed from the same technology that forms the magnetic memory cells and individually programmed to adjust to variations in the separation between the parallel (P) and anti-parallel (AP) states of a group of magnetic memory cells. The plurality of reference cells, numbering as many as eight connected in parallel, are individually programmed to be in a high conductance state or a low conductance state. Whereas more than eight reference cells could be connected in parallel, there is a diminishing return of the benefits of an adaptive reference versus the increase in chip real estate needed to accommodate the increased number of reference devices, control circuitry and the necessary wiring.

As the technology shrinks, variability of cell characteristics across a MRAM chip and between chips can be quite dramatic and negate a single solution to forming a reference that can differentiate between the low conductance of a programmed anti-parallel (AP) magnetic state of a memory cell and the high conductance of a programmed parallel (P) magnetic state of a memory cell. Thus creating a reference from a large number of reference cells where half of the reference cells are programmed as an AP magnetic state and the other half programmed in the P magnetic state reduces the variability of the reference signal and tends to center the reference signal, but the covariance between the two magnetic states of approximately 5% requires that additional techniques be used to allow a meaningful yield of good product. Further, improvement in the forming of a reference signal is accomplished by varying the number of AP and P programmed reference devices that are coupled in parallel and by reducing the neighborhood of the memory cells that are served by a particular personalized reference signal to a small number of memory cells, i.e. those memory cells connected to a particular memory word line.

When the reference circuit becomes unbalanced, more reference devices programmed in the parallel state or more reference devices programmed in the anti-parallel state, there may be a temperature sensitivity that affects the results of tuning the reference to the characteristics of a particular set of magnetic memory cells. Since temperature affects are different on memory cells programmed in the P state than the AP state, it important to take this effect into consideration when there is an unbalance in the number of reference cells programmed as A states and AP states. To correct for temperature dependence caused by a dominance of one state or the other, two reference cells are replaced by two sets of two cells where each set of two cells are connected to an averaging circuit and then connected to the averaging circuit connected to the remaining reference cells. If the programming of the reference cells are balanced, an equal number of each state, the two sets of two cells are each programmed in a way to maintain that balance. If one state or the other dominates the unpaired reference cells then the two paired reference cells are programmed in the opposite state of the dominate state of the un paired reference cells.

BRIEF DESCRIPTION OF THE DRAWINGS

This disclosure will be described with reference to the accompanying drawings, wherein:

FIG. 2 is a graph showing the resistance distribution of a parallel state and a anti-parallel state of magnetic memory devices of the prior art;

FIG. 3 is a graph of the present disclosure demonstrating the range of the adaptive reference;

DETAILED DESCRIPTION

In FIG. 3 of the present disclosure is a graph showing the distribution of resistance of magnetic memory cells that are programmed in the parallel state (Rp) 20 and of the resistance of magnetic memory cells that are programmed in the anti-parallel state (Rap) 21. This is the same graph shown in FIG. 2 with the addition of a "range of adaptive reference level" 30 from which a reference value will be created to be coupled to the reference input of a sense amplifier.

The width of the range of the adaptive reference 30 (shown in FIG. 3) is broad enough to encompass a group of magnetic memory cells that might be attached to a word line and include outliers and other cells serviced by the sense amplifier to which the reference is coupled that vary significantly from the mean distribution of the group. The reason for the need for an adaptive reference is that there is nearly no correlation between the resistance of a parallel programmed magnetic memory cell and the same magnetic memory cell programmed in the anti-parallel state, which is indicated by a covariance of five percent, wherein the magneto-resistance $MR=((Rap-Rp)/Rp) \times 100 = 80\%$. A magneto-resistance of 80% is based on current data, but tunnel magnetoresistance (TMR) can be higher at the cost of other important properties of the devices. Higher TMR would relax the covariance requirement when using a conventional read scheme but not by much. For the present application the TMR won't go much above 150%.

Figure 1:
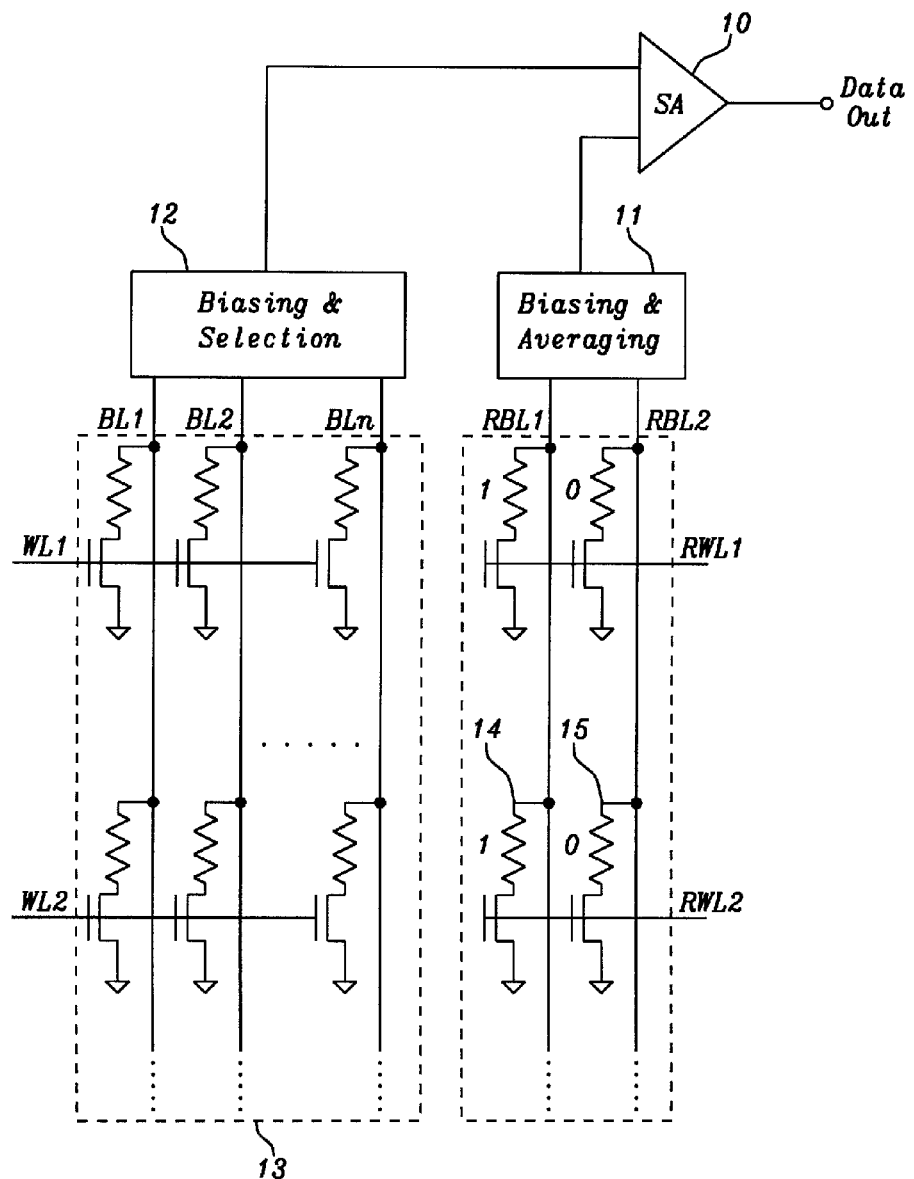
FIG. 1 is a magnetic memory circuit of prior art.
Figure 4:
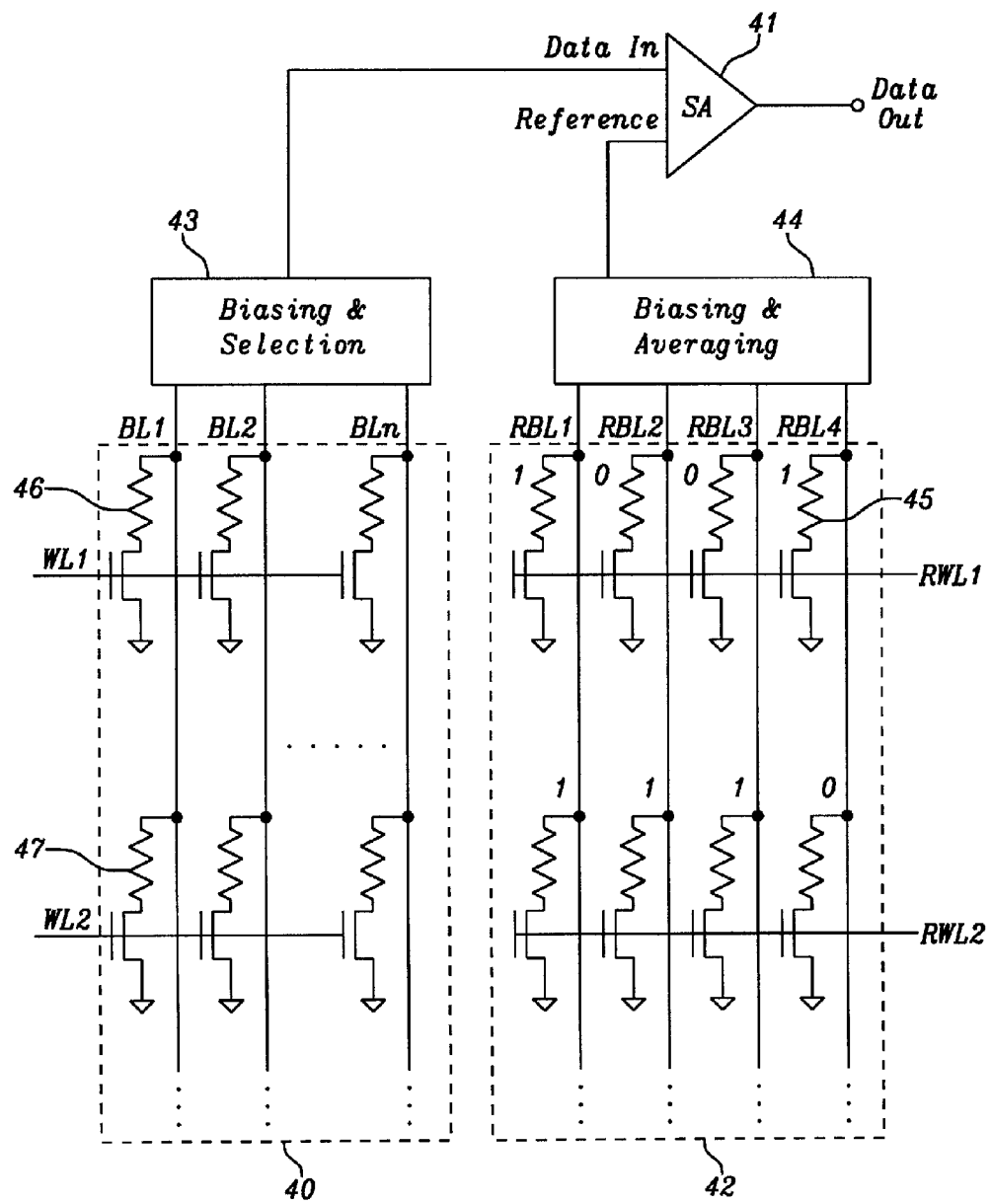
FIG. 4 is a schematic of the present disclosure of a magnetic memory and the associated the adaptive reference cells.

In FIG. 4 is a circuit diagram of the present disclosure of a magnetic memory 40 connected to a data input of a sense amplifier 41 and an adaptive reference 42 that is coupled to the reference input to the sense amplifier 41. The magnetic memory 40 comprises rows of word lines represented by WL1 and WL2, and columns of bit lines represented by BL1, BL2 and BLn. The adaptive reference 42 comprises rows of word lines represented by RWL1 and RWL2 and four columns of bit lines represented by columns RBL1, RBL2, RBL3 and RBL4. Whereas the word line of the memory and the word lines of the reference circuit can be separate entities, the memory word lines and the reference circuit word lines usually are one and the same. When the word lines are the same, WL1 is connected to RWL1, WL2 is connected to RWL 2 and so on for all the word lines in the memory 40 and reference circuit 42.

In the magnetic memory 40, the columns (bit lines) are connected to a biasing and selection circuit 43 that further connects the selected memory bit line to the data input to the sense amplifier 41. The four columns of reference magnetic devices (designated by RBL1, RBL2, RBL3 and RBL 4) are connected to a biasing and averaging circuit 44, which allows the four reference magnetic memory devices connected to a particular reference word line, for instance RWL1, to be averaged and then connected to the reference input to the sense amplifier 41. It should be noted that a particular reference selected by a particular reference word line, for instance RWL1, is associated only with memory cells 46, 47 that are selected by a memory word line, for instance WL1. This reduces the number of memory cells in the memory that a particular sense amplifier must contend, which may reduce the wide variations because of a narrower physical and logical neighborhood. The reduced number of memory cells as well as a closer location of the memory cells can help contain the broad distributions shown in FIG. 3 and help reduce the wide dispersion of magnetic memory cell resistance caused by the low covariance between the parallel and anti-parallel states.

A reference device 45 is a magnetic memory device 46 that has been assigned to forming the adaptive reference of the present disclosure. The reference devices 45 are operated in a similar fashion as the magnetic memory devices where the value of their resistance is changed depending upon whether a particular reference device 45 is programmed into a parallel (P) state representing a logical "0" or the particular reference device 45 is programmed into an anti-parallel state (AP) representing a logical "1". The parallel state (P) is a relatively high conductance (low resistance) and the anti-parallel state (AP) is a lower conductance (higher resistance). In the example shown in FIG. 4, the reference devices couple to the RWL1 word line are programmed to a logical value "1, 0, 0, 1". Thus, bit line RBL1 connects a low conductance, bit line RBL2 connects a high conductance, RBL3 connects a high conductance and RBL 4 connects a low conductance to the biasing and averaging circuit 44. The average of four conductances are then averaged together and used to provide a reference signal to the sense amplifier. The four reference devices connected to the RWL2 word line are programmed to a logical value of "1, 1, 1, 0" because the mean characteristic of the magnetic memory cells 47 on WL2 require a reference created from a relatively lower conductance than the memory cells connected to memory word line WL1 to separate a parallel and an anti-parallel programmed state.

Figure 5A:
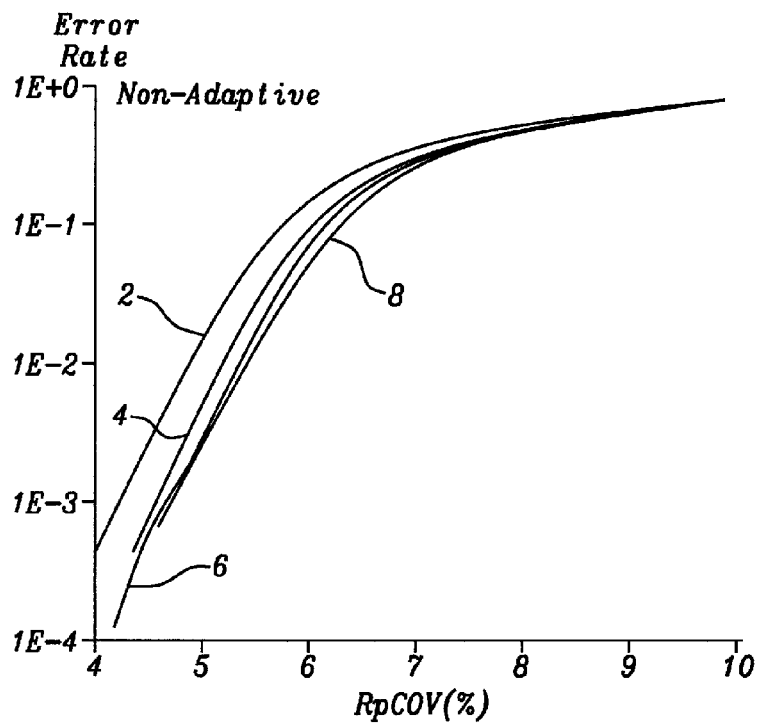
FIG. 5A is a graph of the prior art demonstrating the effects of paralleling reference devices.
Figure 5B:
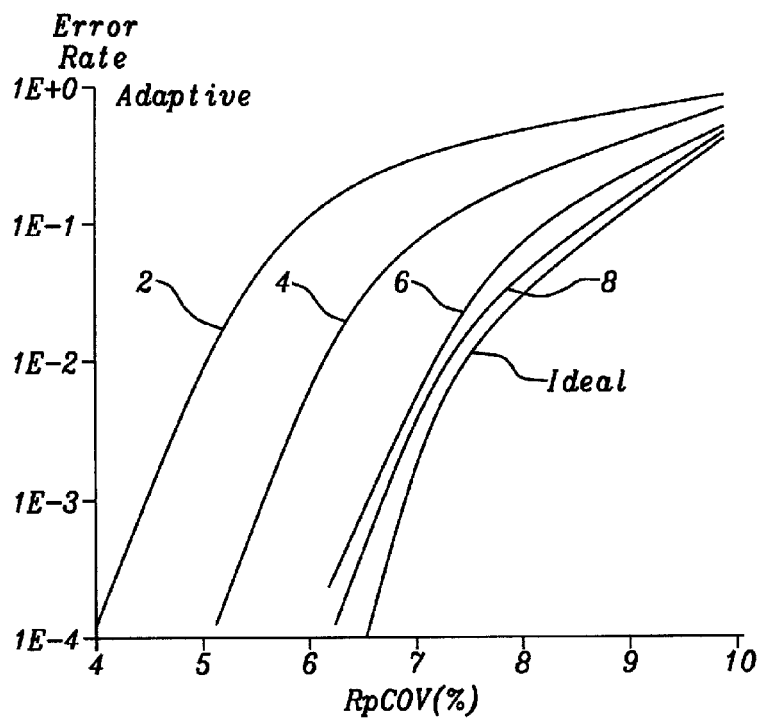
FIG. 5B is a graph demonstrating the effects of the adaptive reference of the present disclosure.

In FIG. 5A is a graph demonstrating the change in error rate in reading magnetic memory cells with a non-adaptive reference circuit, comprising up to eight reference devices connected in parallel to the reference input of the sense amplifier, where RpCOV (%) is the covariance of the resistance distribution in the parallel state. In FIG. 5B the effects of the adaptive reference of the present disclosure are shown, where a much improved effect in error rate is demonstrated up to eight reference cells. FIG. 5B also demonstrates the diminishing return that is obtained in the improving the error rate as more and more reference cells are averaged together.

Figure 6A:
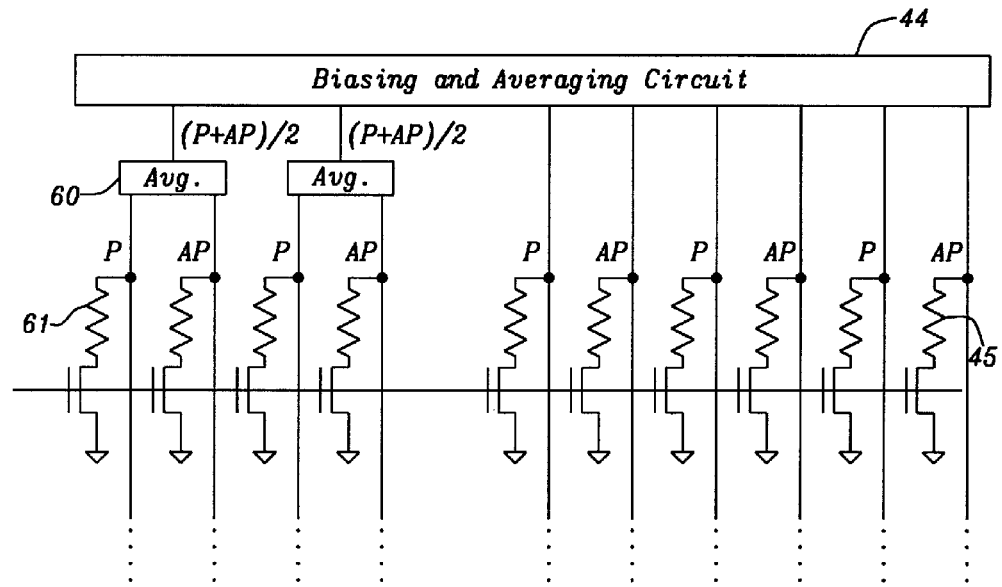
FIGS. 6A and 6B are circuit diagrams of the present disclosure of the adaption of the reference circuit to reducing temperature effects of an imbalance in programmed reference cells.
Figure 6B:
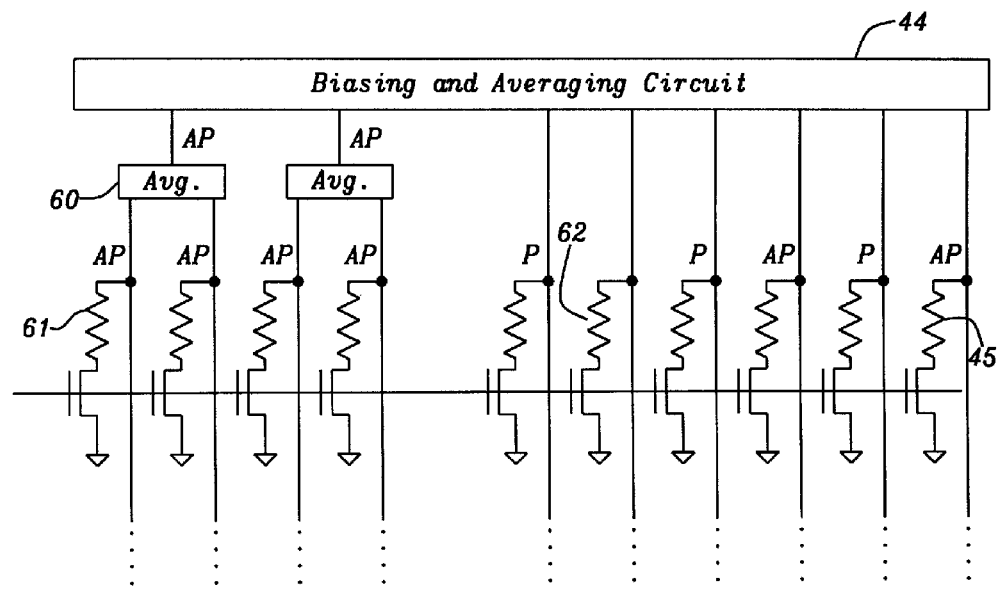

When the number of programmed reference devices 45 becomes unbalanced (more P programmed devices or more AP programmed devices) a change in temperature dependency occurs. Shown in FIG. 6A is a reference circuit that allows the AP and P programmed reference devices 45 to maintain a balance between the two types for thermal reason while allowing the reference devices 45 to be programmed to center the averaging of the resistance of the reference devices to the resistance between the programmed state (P) and the anti-programmed state (AP) of the memory cells being read. Two averaging circuits 60 are each interposed between two reference devices 46 and the biasing and averaging circuit 44. In FIG. 6A half of the reference cells are programmed as P state devices and half are programmed as AP state devices, and the reference circuits 61 are programmed in like manner resulting in a result of (P+AP)/2 being the output of the averaging circuits 60 that are coupled to the bias and averaging circuit 44. In FIG. 6B is shown an example of what happens when a reference cell 62 is changed from an AP program state to a P program state. The reference cells 61 connected to the averaging circuits 60 are both programmed to an AP program state.

Since there is a variation of resistance from device to device, all 10 reference junctions in FIGS. 6A and 6B have different resistances in both the P state and in the AP state. Taking advantage of that variation, the resulting resistance coupled to the sense amplifier 41 has changed between the FIGS. 6A and 6B since a different physical set of MTJ for the P state and AP state is used although the number of MTJ devices in the P state and the AP state hasn't changed This allows the thermal considerations to be maintained while changing the resistance value of the reference connected to the sense amplifier 41 (FIG. 4).

While the disclosure has been particularly shown and described with reference to preferred embodiments thereof, it will be understood by those skilled in the art that various changes in form and details may be made without departing from the spirit and scope of the disclosure.

What is claimed is:

1. An adaptive reference circuit for reading a magnetic memory cell, comprising:
    a) a magnetic memory cell connected to a data input of a sense amplifier;
    b) a reference circuit formed by a plurality of pairs of magnetic memory cells, numbering at least four memory cells, and coupled in parallel to a reference input of the sense amplifier, wherein an impedance value of the plurality of pairs of magnetic memory cells averaged together to provide an adaptive reference signal for reference input to the sense amplifier;
    c) each of the magnetic memory cells of said reference circuit programmed to adjust an average value of the reference circuit, wherein the adaptive reference signal formed from memory cells designated as reference cells and individually programmed to adjust to variations in a separation between parallel and anti-parallel states of memory cells; and
    d) said reference circuit programmed to optimize read performance of the magnetic memory cell and to correct for a change in temperature dependence in the reference circuit.

2. The adaptive reference of claim 1, wherein said reference circuit programmed by centering a resistance value of the programmed reference circuit between that of a parallel state and an anti-parallel state of the magnetic memory cell.

3. The adaptive reference of claim 2, wherein said reference circuit programmed to optimize read performance.

4. The adaptive reference of claim 1, wherein the plurality of magnetic memory cells in a reference circuit limited by a diminishing return of approximately eight pairs of cells connected in parallel.

5. The adaptive reference of claim 1, wherein said change in temperature dependence caused by a majority of a number of reference cells programmed in a first of two magnetic states is reduced by the selection of two pairs of the magnetic memory cells, averaged separately from each other and from the remainder of the reference cells and then averaged together with all reference cells, wherein each cell of the selected two pair of cells is programmed to the magnetic state that is in the minority.

6. A method of creating an adaptive reference circuit for reading a magnetic memory, comprising:
   a) forming a sense amplifier coupled to a plurality of magnetic memory data cells;
   b) forming an adaptive reference circuit comprising an adjustable impedance to be connected to a reference input of the sense amplifier, wherein the adaptive reference circuit comprises at least four memory cells individually programmed to adjust variations of resistance between parallel and anti-parallel states of a group of magnetic memory cells;
   c) programming said adjustable impedance of the adaptive reference circuit to center the adjustable impedance between a parallel state and an anti-parallel state of a magnetic memory data cell being read of the plurality of magnetic memory data cells; and
   d) reading said memory data cell by comparing the adjustable impedance of the adaptive reference to an impedance value between the parallel and anti-parallel states of the magnetic memory data cell being read.

7. The method of claim 6, wherein said adjustable impedance formed by a plurality of magnetic memory reference cells.

8. The method of claim 7, wherein said plurality of magnetic memory reference cells are magnetic memory data cells selected to perform a reference function.

9. The method of claim 7, wherein said plurality of magnetic memory reference cells coupled in parallel between circuit ground and a reference input to a sense amplifier.

10. The method of claim 7, wherein each of the plurality of magnetic memory reference cells programmed to be in the parallel state or the anti-parallel state to alter the impedance value of the adaptive reference circuit.

11. The method of claim 6, wherein said plurality of magnetic memory reference cells is limited to approximately eight magnetic memory data cells caused by a diminishing change in reference circuit impedance when adding an additional magnetic memory reference cell to the reference circuit.

* * * * *